(12) United States Patent
Park et al.

(10) Patent No.: US 9,846,838 B2
(45) Date of Patent: Dec. 19, 2017

(54) SEMICONDUCTOR CIRCUIT USING FLOATING BODY DEVICE FOR EMULATING NEURON FIRING PROCESS

(71) Applicant: Seoul National University R&DB Foundation, Seoul (KR)

(72) Inventors: Byung-Gook Park, Seoul (KR); Min-Woo Kwon, Seoul (KR); Hyungjin Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 473 days.

(21) Appl. No.: 14/635,051

(22) Filed: Mar. 2, 2015

(65) Prior Publication Data
US 2015/0254552 A1  Sep. 10, 2015

(30) Foreign Application Priority Data
Mar. 5, 2014  (KR) .................. 10-2014-0026002

(51) Int. Cl.
*G06N 3/063* (2006.01)
*G11C 11/54* (2006.01)

(52) U.S. Cl.
CPC ............ *G06N 3/0635* (2013.01); *G11C 11/54* (2013.01)

(58) Field of Classification Search
CPC .................. G06N 3/063; G06N 3/065
USPC .......................................... 706/33
See application file for complete search history.

(56) References Cited

U.S. PATENT DOCUMENTS

| 4,961,005 | A | * | 10/1990 | Salam | G06N 3/0635 326/36 |
|---|---|---|---|---|---|
| 5,480,820 | A | | 1/1996 | Roth et al. | |
| 5,578,865 | A | | 11/1996 | Vu et al. | |
| 6,384,624 | B1 | * | 5/2002 | Yasuura | G06N 3/063 326/35 |
| 2016/0048755 | A1 | * | 2/2016 | Freyman | G06N 3/063 365/185.05 |

OTHER PUBLICATIONS

R. Sarpeskar, K. Watts, and C. Mead, California Institute of Technology, CA, CNS Tech. Rep. 1992, 29 pages.

* cited by examiner

*Primary Examiner* — Vincent Gonzales
(74) *Attorney, Agent, or Firm* — Gerald E. Hespos; Michael J. Porco; Matthew T. Hespos

(57) ABSTRACT

The present invention provides a semiconductor circuit for emulating neuron firing process having a floating body device instead of the conventional capacitor. By using a floating body to store excess holes generated by impact ionization, it is possible to emulate signal accumulation of a neuron, trigger firing when the storage is in excess of a predetermined threshold value, and return to an original state after the firing.

9 Claims, 4 Drawing Sheets

SEMICONDUCTOR CIRCUIT USING FLOATING BODY DEVICE FOR EMULATING NEURON FIRING PROCESS

CROSS-REFERENCE TO RELATED APPLICATION

This application claims priority to Korean Patent Application No. 10-2014-0026002, filed on Mar. 5, 2014, under 35 U.S.C. 119, the entire contents of which are hereby incorporated by reference.

BACKGROUND OF INVENTION

1. Field of the Invention

The present invention relates to a semiconductor circuit, and more particularly to a semiconductor circuit for embodying a post-synaptic neuron firing process in a biological synapse.

2. Description of the Related Art

The nervous system of a living body is consisted of numerous nerve cell neurons and synapses connecting neurons. Synapses may be classified as electrical or chemical, based on the signal transmission between neurons. The electrical synapses are found in invertebrates and myocardial cells etc. Since the others are known as the chemical synapses, hereinafter, word of "synapse(s)" indicates the chemical synapse(s).

Recently, many studies have been made to mimic the nervous system of a living body, in particular the brain nervous system, by a nerve-like circuit system (i.e., a neuromorphic computation system) using semiconductor devices.

By the way, in order to embody the neuromorphic computation system, a post-synaptic neuron firing process must be efficiently emulated.

For emulating the post-synaptic neuron firing process, the properties of the nervous system of a living body must be considered. Thus, with reference to FIGS. 1 and 2, the properties of the nervous system of a living body are briefly described.

One neuron 100, as shown in FIG. 1, is connected to a plurality of neurons 200 and 300 by synapses 400 through a plurality of dendrites 120.

Each neuron 100, 200 or 300 has basically a nucleus 110 in a cell body (a soma), and there are a plurality of dendrites 120 to receive a stimulated signal around the cell body and an axon 130 connected by an axon hillock 122 to transmit the stimulated signal to one side of the cell body.

The axon 130 generally has a length of about 10,000 times of diameter of the cell body, is wrapped with a plurality of myelin sheaths 132 interlaid with a node of Ranvier 134 and consists of axon collaterals 136 and axon terminals 138.

A synapse 400, as an enlarged view shown in FIG. 1, indicates a connecting region between two neurons, namely, a meeting region between an axon terminal of the pre-synaptic neuron 200 and a dendrite of the post-synaptic neuron 100 interlaid with the narrow space, as a synaptic cleft 402, of about 20 nm.

The transmission process of the synapse 400 is simply described as the followings with reference to the enlarged view shown in FIG. 1.

First, when a fire is triggered by a stimulation exceeded over the threshold value (Vth, an about −55 mV) in the pre-synaptic neuron 200, the stimulation as an electrical signal is transmitted to the axon terminal through the axon with the repeat of depolarization and repolarization by alternately opening and closing sodium 202 and potassium (not shown) channels, respectively.

The stimulation transmitted to the axon terminal of the pre-synaptic neuron 200 opens a calcium channel 204 and allows an influx of $Ca^{2+}$ ions into the plasma membrane through the calcium channel. The intracellular $Ca^{2+}$ ions bind to vesicles 206 filled up the neurotransmitters 208 and cause the vesicles 206 to fuse into the plasma membrane for releasing the internal neurotransmitters 208 into the synaptic cleft 402. The released neurotransmitters 208 diffuse to flow across the synaptic cleft 402 and arrive at dendrite membranes of the post-synaptic neuron 100.

Here, the neurotransmitters 208 enable the stimulation transmitted from the pre-synaptic neuron 200 through two kinds of channels to be chemically transmitted into the post-synaptic neuron 100.

Exactly, one is a ligand-gated ion channel that uses the diffused neurotransmitter 208 as a ligand which directly binds to the ion channel. Namely, if the neurotransmitter 208 binds to Na+ channel 102, Na+ ion flows into the post-synaptic neuron 100 for contributing towards excitation and if the neurotransmitter 208 binds to K+ channel 104, K+ ion flows out of the post-synaptic neuron 100 for suppressing excitation.

The other is a G-protein coupled receptor 106 mediated ion channel that is activated by the diffused neurotransmitter 208 which directly binds to the G-protein coupled receptor 106 on the plasma membrane of a dendrite in the post-synaptic neuron 100. In this time, an alpha subunit of the G-protein coupled receptor 106 is dissociated and directly couples to the ion channel or indirectly couples to an effecter 108 on the inner membrane for operating this ion channel through an intracellular second messenger (not shown). In other words, if the second messenger couples to a Na+ gate 102, Na+ ion flows into the post-synaptic neuron 100 for contributing towards the excitation and if the second messenger couples to a K+ gate 104, K+ ion flows out from the post-synaptic neuron 100 for suppressing the excitation.

The intracellular Na+ ions flow in the dendrite membrane of the post-synaptic neuron 100 through the Na+ channels 102, diffuse across the cell body and then collect at the axon hillock 122. When the sum of the intracellular Na+ ions and the ions transmitted from other dendrites 120 induces the depolarization by a membrane potential more than the threshold value (Vth) at the axon hillock 122, a fire is produced as a spike signal shown in FIG. 2. The spike signal is an electrical signal for transmission of the stimulation by again repeating the depolarization and the repolarization along the axon 130 of the post-synaptic neuron 100.

In FIG. 1, the stimulation is transmitted from the pre-synaptic neuron 300 to two different dendrites 120 of the post-synaptic neuron 100 through two different synapses by two signals (a) and (b), respectively and can be fired when the sum (a+b) of two signals (a) and (b) is exceeded over the threshold value (Vth) at the axon hillock 122 of the post-synaptic neuron.

In FIG. 2, when the membrane potential reaches the threshold value (Vth, −55 mV) at the point ①, the membrane of the axon 130 of the post-synaptic neuron 100 opens the Na+ channels, which allow Na+ ion inflow to produce a fire by a sudden membrane potential rising and then, at the point ②, closes the Na+ channels and simultaneously opens the K+ channels, which allow K+ ion outflow to reduce the membrane potential until the K+ channels are closed at about −80 mV, and then maintains −70 mV of the resting (equilibrium) membrane potential by operations of Na+ pumps and K+ pumps.

By the above mentioned reasons, the first fire is mainly generated at the axon hillock 122 of the post-synaptic neuron 100 and the Na+ ions entered by the first fire are rapidly diffused by the myelin sheath 132 to depolarize the neighbor axon membrane. As a result, the spike waveform as shown in FIG. 2 is transmitted to the axon terminal.

On the other hand, although depending on the kind of a living body, the nervous system of a living body is consisted of enormous neurons. For example, the brain nervous system of a human is consisted of about $10^{11}$ neurons and each neuron is connected to about 1,000 synapses. Thus, the human brain nervous system is consisted of about $10^{14}$ synapses (Larry R. Squire, Eric R. Kandel, "MEMORY From Mind to Molecules", Roberts & Company, 2nd ed., p. 30).

Therefore, in order to embody the neuromorphic computation system, it is indispensable to efficiently emulate the operating property of the enormous neurons.

Especially, it is very important to precisely and efficiently embody a firing process occurred in the axon hillock 122 of each neuron.

Until now, a representative model among the models of integrate-and-fire neuron circuits for emulating the firing process in the axon hillock 122 is the Mead's Axon-Hillock model (R. Sarpeskar, L. Watts, and C. Mead, California Institute of Technology, CA, CNS Tech. Rep. 1992).

By the way, because the Mead's model and the conventional most integrate-and-fire neuron circuits based on the Mead's model are using capacitors to accumulate the signals, all of the area, the power consumption and the delay time are increased to mimic each neuron. Especially, it is very difficult to implement the neuromorphic computation system consisted of the enormous neurons in a single chip.

SUMMARY OF THE INVENTION

The present invention suggests to solve the problem for the conventional methods using capacitors by substituting with a device having a floating body to store excess holes generated by impact ionization and is directed to provide a semiconductor circuit, for emulating the neuron firing process, having the floating body device which emulates a signal accumulation of a neuron, triggers firing when the storage is in excess of a predetermined threshold value, and returns to an original state after the firing.

To achieve the objective, a semiconductor circuit for emulating a neuron firing process according to the present invention comprises: a control device having a floating body connected between a ground and a first node; a first and second p-channel MOSFETs having source/drain electrodes connected in parallel between the first node and an electric power input terminal; and a first and second inverters connected in series between the first node and a gate electrode of the first p-channel MOSFET, wherein an output terminal of the first inverter is connected to a gate electrode of the second p-channel MOSFET to form a first feedback loop, wherein an output terminal of the second inverter is connected to the gate electrode of the first p-channel MOSFET through a second node to form a second feedback loop, wherein an electrical signal transmitted from a pre-synaptic neuron is input to a gate electrode of the control device, and wherein an electrical signal in response to a firing in the axon hillock of a post-synaptic neuron is gained from the output terminal of the first inverter.

Here, the control device may be an n-channel MOSFET having a floating body. Especially, the control device may have a plurality of gate electrodes formed on the floating body.

The floating body may be electrically isolated from source/drain regions of the control device by pn junction, store excess holes generated by impact ionization in a depletion layer at the side of the drain region for reducing an electric potential barrier of a channel, and decrease a voltage of the first node to the ground voltage in a predetermined time. Thus, the semiconductor circuit according to this embodiment can emulate signal accumulation of a neuron through the floating body.

It is possible to emulate the neuron firing process that when the voltage of the first node is dropped to the ground voltage, the first inverter outputs the electrical signal in response to the axon hillock firing of the post-synaptic neuron and, at the same time, the second p-channel MOSFET is turned off by the first feedback loop and the first p-channel MOSFET is turned on by the second feedback loop for raising again the voltage of the first node and returning to an original state.

The present invention enables not only to significantly reduce the area of a neuron-mimicking circuit by using a floating body device instead of the conventional capacitor, but also to emulate a neuron firing process coming from the stimulation exceeded over a threshold value by hole accumulation. And the present invention enables to emulate a plurality of dendrites connected to axon hillock by forming a plurality of gates in the floating body device. Additionally, the present invention enables to precisely embody not only the generation of electrical signals according to the axon hillock firing of a post-synaptic neuron, but also the action of a neuron for returning to the original state after the firing by configuring the first and second feedback control-circuits with two p-channel MOSFETs and two inverters.

BRIEF DESCRIPTION OF THE DRAWINGS

FIG. 5 shows voltage waveforms at each of points, respectively, when a high input voltage corresponding to the stimulus exceeded over a threshold value is applied to one of gate electrodes. FIGS. 6 and 7 show a hole concentration of a floating body and a drain current, respectively, when 0.6V is simultaneously applied to three gate electrodes. FIG. 8 shows an output pulse voltage from the output terminal of a first inverter when 0.5V is applied to the gate electrodes in a predetermined interval.

In these drawings, the following reference numbers are used throughout: reference number 10 indicates a buried insulating layer, 20 a floating body, 30 a source region, 40 a drain region, 50 a gate insulator, 60 a source electrode, 70 a drain electrode, 80 a gate electrode, 101 a control device, 201 a first p-channel MOSFET, 301 a second p-channel MOSFET, 401 a first inverter, 501 a second inverter and 601 an input terminal of an electric power.

DETAILED DESCRIPTION

Detailed descriptions of preferred embodiments of the present invention are provided below with reference to accompanying drawings. The structures or the electrical characteristic diagrams of exemplified devices in the accompanying drawings are provided to explain the technical idea of the present invention in order to understand a person with ordinary skill in the art to which the present invention pertains, thus, the technical idea of the present invention should not be restricted to the described embodiments herein.

Figure 3:
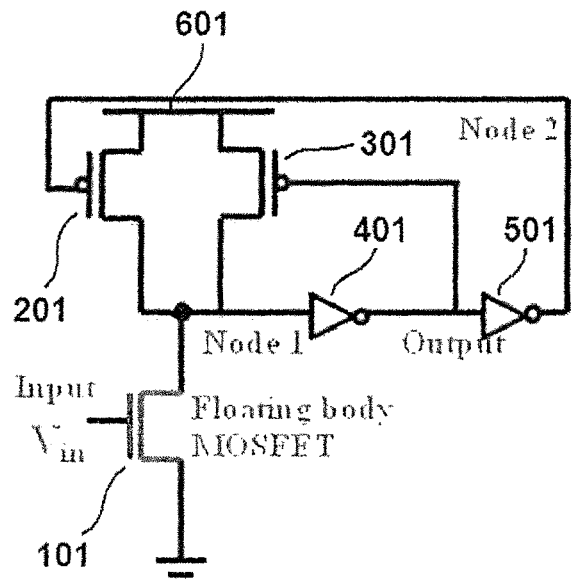
FIG. 3 is a diagram showing a configuration of a semiconductor circuit for emulating a neuron firing process according to one embodiment of the present invention.

A semiconductor circuit for emulating a neuron firing process according to an embodiment of the present invention, as shown in FIG. 3, comprises: a control device 101 having a floating body connected between a ground (GND) and a first node (Node 1); a first and second p-channel MOSFETs 201 and 301 having source/drain electrodes connected in parallel between the first node (Node 1) and an electric power input terminal 601; and a first and second inverters 401 and 501 connected in series between the first node (Node 1) and a gate electrode of the first p-channel MOSFET 201.

Here, an output terminal (Output) of the first inverter 401 is connected to a gate electrode of the second p-channel MOSFET 301 to form a first feedback loop and an output terminal of the second inverter 501 is connected to the gate electrode of the first p-channel MOSFET 201 through a second node (Node 2) to form a second feedback loop.

And an electrical input signal (Input, Vin) transmitted from a pre-synaptic neuron is input to a gate electrode of the control device 101 and an electrical signal in response to a firing in the axon hillock of a post-synaptic neuron is gained from the output terminal (Output) of the first inverter 401.

The control device 101 may be a semiconductor device having a floating body as long as it can store specific carriers generated by responding to an input signal (Input, Vin) of the gate electrode.

Here, the floating body is electrically isolated from the surroundings by the gate electrode positioned adjacent thereto and may be configured with a variety of structures. One example, as shown in FIG. 4, the floating body 20 may be isolated from the lower side by a burred insulating layer 10 or a well having a different conductive type, may be separated from the right and left sides by a depletion region of pn junction formed with source and drain regions 30 and 40 having a different conductive type, and may be isolated from the other sides by forming an insulating layer etc.

Thus, the control device 101 may have an n-channel or p-channel device structure according to the conductive type of the floating body. However, as the above mentioned embodiment, when the first and second feedback control circuits are formed with two p-channel MOSFETs 201 and 301 and two inverters 401 and 501, it is preferable that the control device 101 is an nMOSFET having an n-channel structure.

Figure 4:
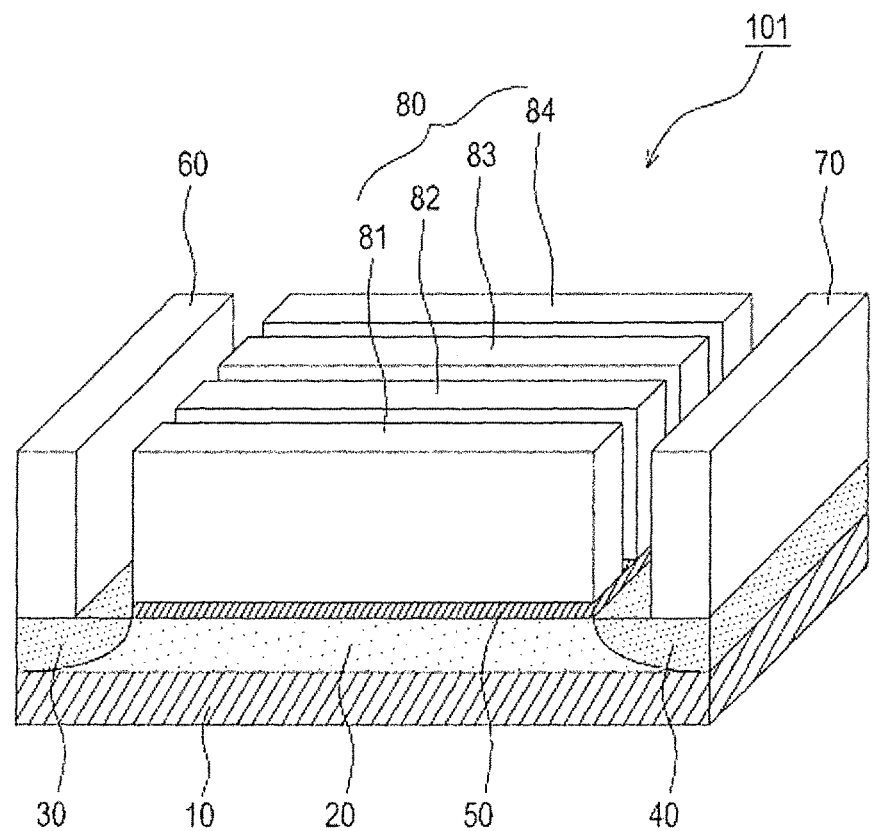
FIG. 4 is a perspective diagram showing a structure of a MOSFET having a plurality of gate electrodes as one embodiment of a control device shown in FIG. 3.

And the control device 101 may have one gate electrode 80 interlaying a gate insulating layer 50 on the floating body 20, but it is preferable to have a plurality of gate electrodes 81, 82, 83 and 84 shown in FIG. 4.

Figure 1:
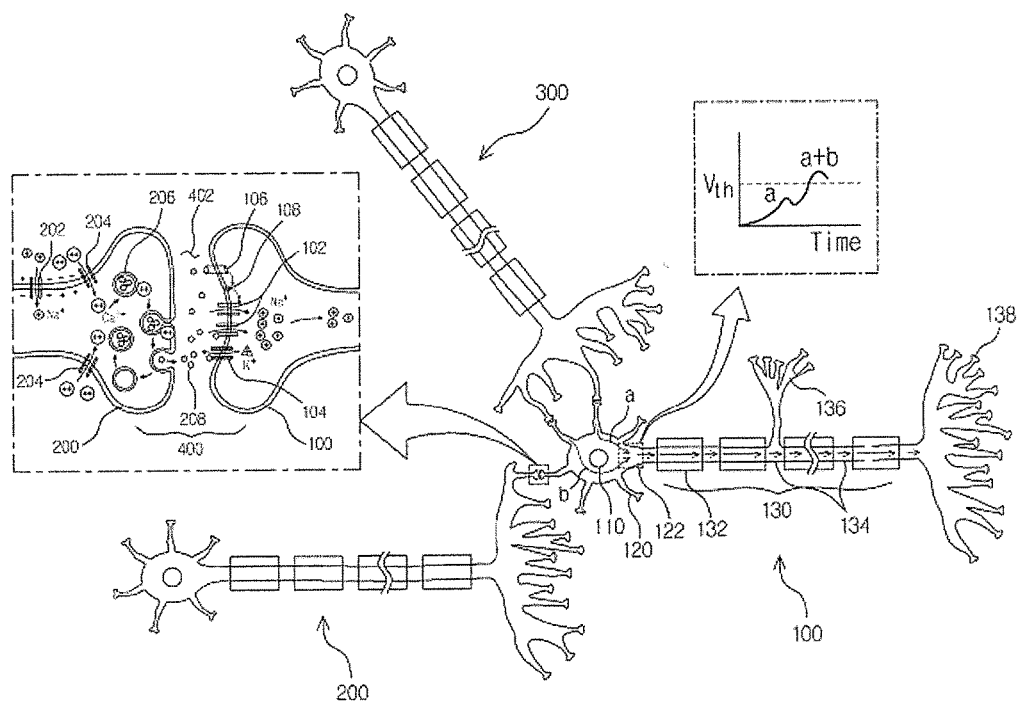
FIG. 1 is a conceptual diagram for explaining a neuron structure and a transmission of stimulation fired in the axon hillock.

The plurality of gate electrodes 81, 82, 83 and 84 can emulate a plurality of dendrites 120 connected to the axon hillock 122 as shown in FIG. 1. Thus, the number of the gate electrodes 80 in the control device 101 may be corresponded to the same number of the dendrites connected to the axon hillock 122 of the post-synaptic neuron 100.

In FIG. 4, the source region 30 and the drain region 40 may be electrically connected to the source electrode 60 and the drain electrode 70, respectively.

Hereinafter, the disclosed is explained with an n-channel MOSFET control device 101 having a structure according to the embodiment shown in FIG. 4, but it is not limited to this.

When a positive input pulse signal (Vin) as the stimulus transmitted from the pre-synaptic neuron is applied to one or more of the gate electrodes 81, 82, 83 and 84 of the control device 101, an n-channel can be transiently formed at the upper surface of the p-type floating body 20 between the n-type source region 30 and the n-type drain region 40 and excess holes generated by impact ionization in a depletion region at the side of the drain region 40 can be transferred into the p-type floating body 20.

The excess holes transferred into the p-type floating body 20 may be stored for a moment before disappearing by recombination etc. and can reduce the conduction band (the electric potential barrier) by increasing the body voltage. As a result, continuously subsequent stimuli or simultaneously incoming stimuli can easily form a channel for the positive input pulse signal (Vin) applied to the gate electrodes 81, 82, 83 and 84 of the control device 101 and reduce the resistance of the channel.

By the above mentioned principle, the electrical signals in response to the stimuli transmitted from the post-synaptic neuron can be continuously stored as the excess holes in the p-type floating body 20 and a voltage of the first node is decreased to the ground voltage in a predetermined time. At this time, the channel resistance may be disappeared and the voltage of the first node (Node 1) may be dropped to the ground voltage. This operation can be used to emulate the neuron firing process.

Particularly, as shown in FIG. 3, in case that the first and second feedback loops are configured with two p-channel MOSFETs 201 and 301 and two inverters 401 and 501, when the voltage of the first node (Node 1) is dropped to the ground voltage, the first inverter 401 outputs the electric input signal in response to the axon hillock firing of the post-synaptic neuron and, at the same time, the second p-channel MOSFET 301 is turned off by the first feedback loop and the first p-channel MOSFET 201 is turned on by the second feedback loop for raising again the voltage of the first node (Node 1) and returning to an original state.

FIGS. 5 to 8 are electrical characteristic diagrams gained from simulations of the structure according to an embodiment shown in FIG. 4.

Figure 5:
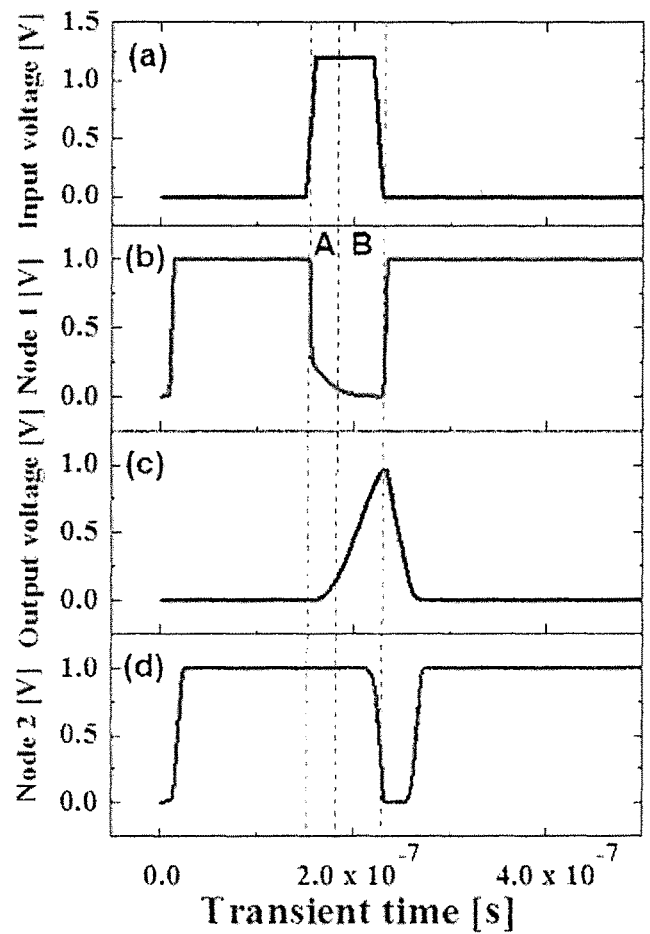
FIGS. 5 to 8 are electrical characteristic diagrams gained from simulations of the structure shown in FIG. 4.

FIG. 5 shows voltage waveforms at each of points, respectively, when a high input voltage corresponding to the stimulus exceeded over a threshold value is applied to one of the gate electrodes 81, 82, 83 and 84 of the control device 101.

As shown in FIG. 5(a), when a high input voltage corresponding to the stimulus exceeded over a threshold value is applied to one of the gate electrodes 81, 82, 83 and 84 of the control device 101, the voltage of the first node (Node 1) is shapely dropped to the ground voltage by a channel formation. During the channel formation period, in the A period shown in FIG. 5(b), a large number of the excess holes generated by impact ionization is transiently transferred into and stored in the floating body 20. In the B period shown in FIG. 5(b), the excess holes stored in the floating body 20 may flow out toward the source and drain regions 30 and 40 to be erased and returned to the original state.

Next, when the channel is turned off by an abrupt drop of the input voltage (Input, Vin) applied to the gate electrode 80, through the first and second feedback control circuits consisted of two p-channel MOSFETs 201 and 301 and two inverters 401 and 501, the output terminal (Output) of the first inverter 401 may be a high voltage, as shown in FIG. 5(*c*), which applies to the gate electrode of the second p-channel MOSFET 301 and turns off the second p-channel MOSFET 301. At this time, the second node (Node 2) may be a low voltage, as shown in FIG. 5(*d*), which applies to the gate electrode of the first p-channel MOSFET 201 and turns on the first p-channel MOSFET 201. Consequently, a high voltage of the electric power input terminal 601 may be applied to the first node (Node 1) and the voltage of the first node (Node 1) may be returned to the high voltage state like the waveform later than the period B of FIG. 5(*b*).

Figure 2:
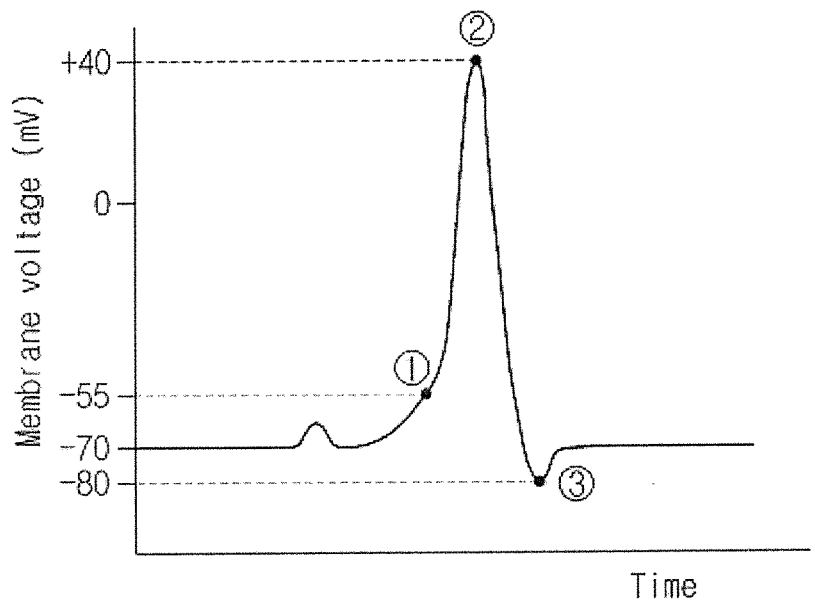
FIG. 2 is a diagram of a spike waveform showing a membrane potential change of a neuron.

By the above mentioned operation, the output terminal (Output) of the first inverter 401, as shown in FIG. 5(*c*), generates a pulse spike waveform as similar to that shown in FIG. 2. Consequently, the electrical signal in response to the axon hillock firing of the post-synaptic neuron can be embodied.

Figure 6:
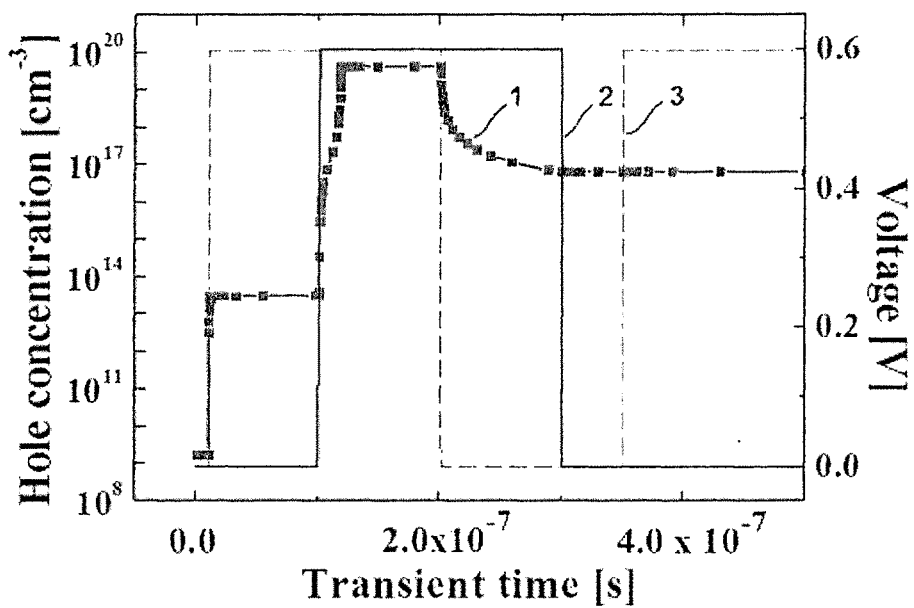
Figure 7:
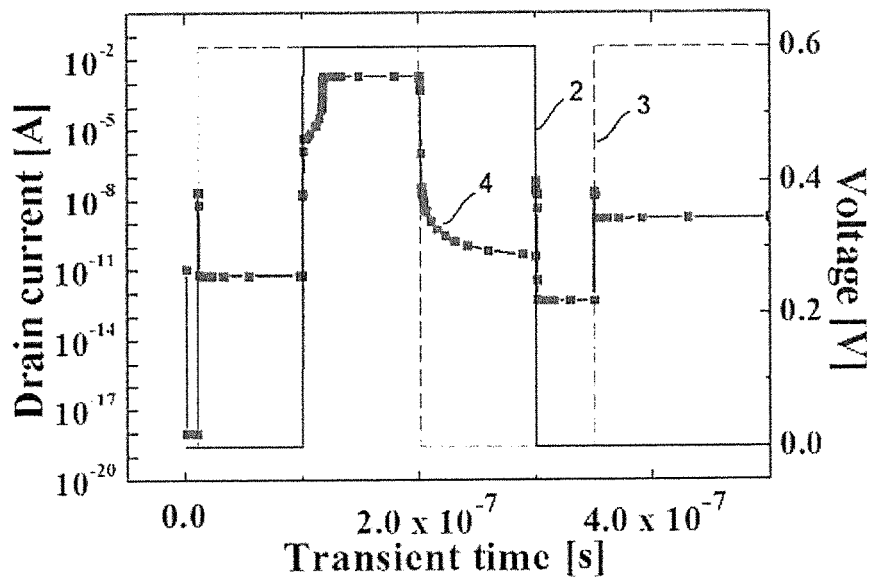

FIGS. 6 and 7 show a hole concentration 1 of a floating body and a drain current 4, respectively, when a 0.6V pulse voltage 2 is simultaneously applied to three of gate electrodes 81, 82, 83 and 84 of the control device 101.

From the simulation results as shown in FIGS. 6 and 7, although each stimulus is smaller than the threshold value, when the stimuli are simultaneously applied to the plurality of gate electrodes 81, 82, 83 and 84, i.e., different dendrites 120 from each other, of the control device 101, the drain current 4 is abruptly increased because the channel is completely turned on by the excess holes stored in the floating body 20 and the voltage 3 of the first node (Node 1) generates a pulse shape by the first and second feedback control circuits configured with two p-channel MOSFETs 201 and 301 and two inverters 401 and 501.

As a result, the output terminal (Output) of the first inverter 401 generates the pulse spike waveform of FIG. 5(*c*) in the embodiment shown in FIGS. 6 and 7. Consequently, the electrical signal in response to the axon hillock firing of the post-synaptic neuron can be gained.

Figure 8:
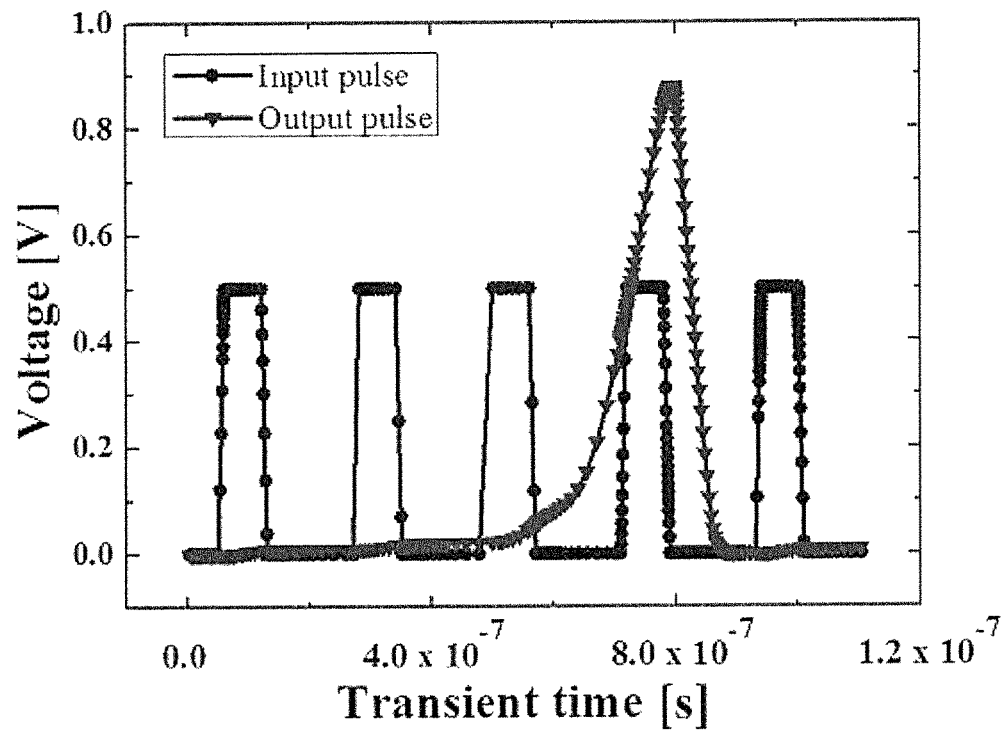

FIG. 8 shows an output pulse voltage, as a pulse spike waveform shown in FIG. 5(*c*), generated in the output terminal (Output) of the first inverter 401 when the input voltage of 0.5V smaller than that of corresponding to the threshold value is applied with an predetermined interval to one or more of the gate electrodes 81, 82, 83 and 84 of the control device 101. This operation principle is also equal to that of the above mentioned embodiment. But, in the latter embodiment, there is a different point that the input voltages have to be applied with a predetermined interval before the extinction of the excess holes injected into the floating body 20 by the recombination, etc. to generate the output pulse voltage as shown in FIG. 8.

In the disclosed semiconductor circuits for emulating neuron firing process, the control device, as the mentioned above, is mainly explained with an n-channel MOSFET having a structure shown in FIG. 4, but it is not limited to this. In this description, the carrier indicates an electron or hole that can make a current (i.e., a flow of charges) and the excess hole indicates a hole that exists in a state higher than a thermal equilibrium state (i.e., a neutral state) in a semiconductor.

What is claimed is:

1. A semiconductor circuit for emulating a neuron firing process, comprising:

a control device having a floating body connected between a ground and a first node;

a first and second p-channel MOSFETs having source/drain electrodes connected in parallel between the first node and an electric power input terminal; and a first and second inverters connected in series between the first node and a gate electrode of the first p-channel MOSFET, wherein an output terminal of the first inverter is connected to a gate electrode of the second p-channel MOSFET to form a first feedback loop, wherein an output terminal of the second inverter is connected to the gate electrode of the first p-channel MOSFET through a second node to form a second feedback loop, wherein an electrical signal transmitted from a pre-synaptic neuron is input to a gate electrode of the control device, and wherein an electrical signal in response to a firing in the axon hillock of a post-synaptic neuron is gained from the output terminal of the first inverter.

2. The semiconductor circuit for emulating the neuron firing process of claim 1, wherein the control device is an n-channel MOSFET having a floating body.

3. The semiconductor circuit for emulating the neuron firing process of claim 2, wherein the control device has a plurality of gate electrodes formed on the floating body.

4. The semiconductor circuit for emulating the neuron firing process of claim 3, wherein the floating body is electrically isolated from source/drain regions of the control device by pn junction, stores excess holes generated by impact ionization in a depletion layer at the side of the drain region for reducing an electric potential barrier of a channel, and decreases a voltage of the first node to the ground voltage in a predetermined time.

5. The semiconductor circuit for emulating the neuron firing process of claim 4, wherein when the voltage of the first node is dropped to the ground voltage, the first inverter outputs the electric signal in response to the axon hillock firing of the post-synaptic neuron and, at the same time, the second p-channel MOSFET is turned off by the first feedback loop and the first p-channel MOSFET is turned on by the second feedback loop for raising again the voltage of the first node and returning to an original state.

6. The semiconductor circuit for emulating the neuron firing process of claim 2, wherein the floating body is electrically isolated from source/drain regions of the control device by pn junction, stores excess holes generated by impact ionization in a depletion layer at the side of the drain region for reducing an electric potential barrier of a channel, and decreases a voltage of the first node to the ground voltage in a predetermined time.

7. The semiconductor circuit for emulating the neuron firing process of claim 6, wherein when the voltage of the first node is dropped to the ground voltage, the first inverter outputs the electric signal in response to the axon hillock firing of the post-synaptic neuron and, at the same time, the second p-channel MOSFET is turned off by the first feedback loop and the first p-channel MOSFET is turned on by the second feedback loop for raising again the voltage of the first node and returning to an original state.

8. The semiconductor circuit for emulating the neuron firing process of claim 1, wherein the floating body is electrically isolated from source/drain regions of the control device by pn junction, stores excess holes generated by impact ionization in a depletion layer at the side of the drain region for reducing an electric potential barrier of a channel, and decreases a voltage of the first node to the ground voltage in a predetermined time.

9. The semiconductor circuit for emulating the neuron firing process of claim 8, wherein when the voltage of the first node is dropped to the ground voltage, the first inverter outputs the electric signal in response to the axon hillock firing of the post-synaptic neuron and, at the same time, the second p-channel MOSFET is turned off by the first feedback loop and the first p-channel MOSFET is turned on by the second feedback loop for raising again the voltage of the first node and returning to an original state.

* * * * *